United States Patent [19]

Rairden, III

[11] 4,084,025

[45] Apr. 11, 1978

[54] PROCESS OF APPLYING PROTECTIVE ALUMINUM COATINGS FOR NON-SUPER-STRENGTH NICKEL-CHROMIUM ALLOYS

[75] Inventor: John R. Rairden, III, Niskayuna, N.Y.

[73] Assignee: General Electric Company, Schenectady, N.Y.

[21] Appl. No.: 689,450

[22] Filed: May 24, 1976

Related U.S. Application Data

[63] Continuation-in-part of Ser. No. 494,036, Aug. 2, 1974, abandoned.

[51] Int. Cl.$^2$ .......................... C23C 1/08; C23C 9/02; C23C 13/02
[52] U.S. Cl. ...................................... 427/229; 427/250; 427/253; 427/383 D; 427/431; 428/652; 204/181 N; 75/171
[58] Field of Search ........... 427/250, 252, 253, 383 D, 427/229, 131; 428/652

[56] References Cited

U.S. PATENT DOCUMENTS

| | | | |
|---|---|---|---|
| 3,073,015 | 1/1963 | Wachtell et al. | 427/253 X |
| 3,257,230 | 6/1966 | Wachtell et al. | 427/250 X |
| 3,640,815 | 2/1972 | Schwartz et al. | 427/252 X |
| 3,764,371 | 10/1973 | Baldi | 427/253 |
| 3,824,122 | 2/1973 | Cook et al. | 427/252 |

*Primary Examiner*—Ralph S. Kendall
*Attorney, Agent, or Firm*—F. Wesley Turner; Joseph T. Cohen; Jerome C. Squillaro

[57] ABSTRACT

The invention relates to a method of forming a high temperature oxidation resistant coating on a nickel-chromium alloy body. The method includes incorporating into a nickel-chromium alloy a sufficient amount of cobalt to effect a change in coating morphology when the alloy is aluminized; and thereafter subjecting the body to a coating of aluminum.

14 Claims, 7 Drawing Figures

PROCESS OF APPLYING PROTECTIVE ALUMINUM COATINGS FOR NON-SUPER-STRENGTH NICKEL-CHROMIUM ALLOYS

CROSS-REFERENCES TO RELATED APPLICATIONS

This is a continuation-in-part of application Ser. No. 494,036, filed Aug. 2, 1974 now abandoned.

BACKGROUND OF THE INVENTION

1. Field of the Invention

The invention relates to a method of forming a high temperature oxidation resistant coating on a nickel-chromium alloy body. The method includes incorporating into a nickel-chromium alloy a sufficient amount of cobalt to effect a change in coating morphology when the alloy is aluminized, and thereafter subjecting the body to a coating of aluminum.

2. Description of the Prior Art

While aluminide coatings of superalloys which generally contain iron, nickel, cobalt or chromium, singularly or in combination as the basis for their composition, as well as one or more additions of elements, such as molybdenum, tungsten, rubidium, titanium, tantalum and/or aluminum for the express purpose of solid solution strengthening are known, the general mechanical integrity characteristics of aluminide coatings of superalloys cannot be projected to non-super-strength alloys, e.g. nickel-chromium alloys, since non-super-strength alloys being free of solid solution strengthening elements have different morphologies, e.g. microstructures, than superalloy morphologies.

Heretofore, it has been reported by L. A. Monson et al. Technical Report AFML-TR-66-47, Part I (March 1966), that aluminide coatings on certain nickel-chromium alloys (thoria dispersed nickel-chromium alloys) were extremely porous. Porosity has been attributed to the unequal diffusivities of nickel and aluminum with nickel leaving the substrate and diffusing out faster than aluminum diffuses in from the surface. This unequal diffusion flux apparently results in vacancies which appear to coalesce, quite likely on the few larger thoria particles forming voids.

In general, spalling of the aluminide coatings on nickel-chromium alloys is associated with porosity at the coating substrate interface. Heretofore, the exact cause of delamination between the outer and inner region of the aluminide coatings on nickel-chromium alloys has not been fully understood. In general, however, it was believed that delamination occurred at or near a thin continuous region of a high α-chromium phase that developed during the aluminizing of the nickel-chromium alloys. Further, it was believed that the high α-chromium phase tended to be very brittle which lead to delamination of the coating caused by fractures along or near the high chromium phase due to stresses resulting from a thermal expansion mismatch between the coating layer and the substrate. Still another possible cause of delamination was believed to be the formation of Kirkendall voids at or near the region of the high chromium phase. Presumably the high chromium phase acted as a "diffusion barrier" to the inwardly diffusing aluminum atoms, while acting as a "diffusion medium" for the outwardly diffusing nickel atoms. A layer of voids at or near the high chromium phase was believed to lead to a loss of contact between the coating and the substrate.

DESCRIPTION OF THE INVENTION

In accordance with the present invention, I have discovered a method of improving the high temperature oxidation resistance of a nickel-chromium alloy body by incorporating into the body a sufficient amount of cobalt to effect a change in the coating morphology when the alloy is aluminized, and thereafter subjecting the body to a coating of aluminum. The aluminum coating is characterized as being dense, nonporous and adherently bonded to the substrate.

The term "nickel-chromium alloy" as used herein and in the appended claims broadly describes alloy compositions and associated physical properties as set out in Metals Handbook, 8th Edition, Vol. 1, ASM (1961), pages 620–625. These nickel-chromium alloys are well-known for having heat resistant and corrosion resistant properties and are primarily useful in the manufacture of electric resistant heating elements, however, have other uses which include thermocouple sheaths, tensile-test grips, and various other types of furnace hardware.

In general, the nickel-chromium alloy of my invention contains a sufficient amount of cobalt to effect a change in the coating morphology when the alloy is aluminized. These alloys can be manufactured by conventional melting and casting techniques, including the nickel-chromium alloy manufacturing techniques disclosed in the *Metals Handbook* cited above. The general composition of the alloys contain 10–30% chromium, 2–20% cobalt, 0–2.5% manganese, 0–1.5% silicon, 0.–1.0% iron, 0–0.25% carbon, 0–0.1% sulfur, and balance nickel, with a generally preferred composition containing at least 5% cobalt.

A presently preferred nickel-chromium alloy contains, on a weight basis, 19–21% chromium, 4–6% cobalt, 0–2.5% manganese, 0–1.5% silicon, 0–1.0% iron, 0–0.25% carbon, 0–0.01% sulfur, and the balance being essentially nickel.

Also included in my invention are oxide dispersion strengthened nickel-chromium alloys such a TD NiCr. These dispersion strengthened class of alloys include compositions consisting essentially of 10–30% chromium, 2–20% cobalt, 0–2.5% manganese, 0–1.5% silicon, 0–1.0% iron, 0–0.25% carbon, 0–0.01% sulfur, the balance being nickel subject to the proviso that the alloy contain a dispersed phase of 2–3 volume percent of thoria, with the peferred composition containing at least 5% cobalt and 2% by volume $ThO_2$.

As noted before, the amount of cobalt incorporated into the nickel-chromium alloy is within the range of from 2% to 20% by weight. Throughout this cobalt compositional range, aluminized nickel-chromium alloys when aluminized as described hereinbelow, exhibit an adherently bonded, pore-free aluminum coating. As cobalt in solid solution is added to a nickel-chromium alloy, it is expected that the hardness of the resulting alloy will increase, thereby making fabrication of the alloy into complex shapes increasingly difficult. Therefore, for any specific application the percent of cobalt in the alloy should be selected on the basis of hardness and workability properties desired.

In the practice of this invention, the nickel-chromium-cobalt alloy body is aluminized to form a layer, preferably 1.0 to 3.0 mils thick. The aluminide coating can be applied to the substrate using any commonly used aluminide coating method such as pack cementation, slurry and diffusion, electrophoresis and diffusion, hot dipping, chemical vapor deposition, fused salt metalliding, physical vapor deposition, etc. Preferably pack cementation techniques are employed which involves placing the substrate in a metal or graphite retort containing a mixture of an inert oxide filler or diluent, a halide salt, and a source of aluminum. The inert filler supports the article to be coated and the retort is usually sealed with sand or low melting glass powder. Upon heating, the salt decomposes and reacts with the aluminum to form a gaseous aluminum halide which serves to transfer the aluminum to the surface of the substrate alloy. A preferred type of aluminide pack cementation coating useful in the present invention is the high activity pack containing about 3–20% by weight of aluminum. The most practical activator is a halide salt selected from NaF, KF, NH$_4$Cl, and NH$_4$F in an amount of about 0.1–10% by weight of the mixture. The preferred inert filler is a refractory alumina powder which comprises about 10–96% by weight of the total pack. A representative pack contains in weight percent of about 5.8% Al, 0.2% NH$_4$F and the balance Al$_2$O$_3$.

The invention is more clearly understood from the following description taken in conjunction with the accompanying drawings. All percentages are percents by weight unless otherwise stated.

Figure 5:
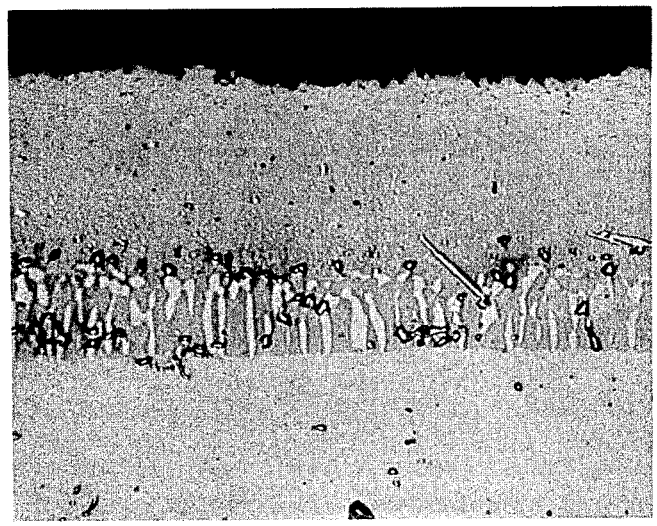
FIG. 5 is a photomicrograph (750×) of an aluminized nickel-base superalloy, i.e. a Rene 80 super-strength alloy, containing 59.68% Ni — 14% Cr — 9.5% Co — 4.0% Mo — 4.0% W — 5.0% Ti — 3.0% Al — 0.2% Fe — 0.17% C — 0.2% Mn — 0.2% Si — 0.03% Zr and 0.01% B which is not of the invention. The alloy was aluminized in accordance with the procedures employed in the practice of my invention.
Figure 6:
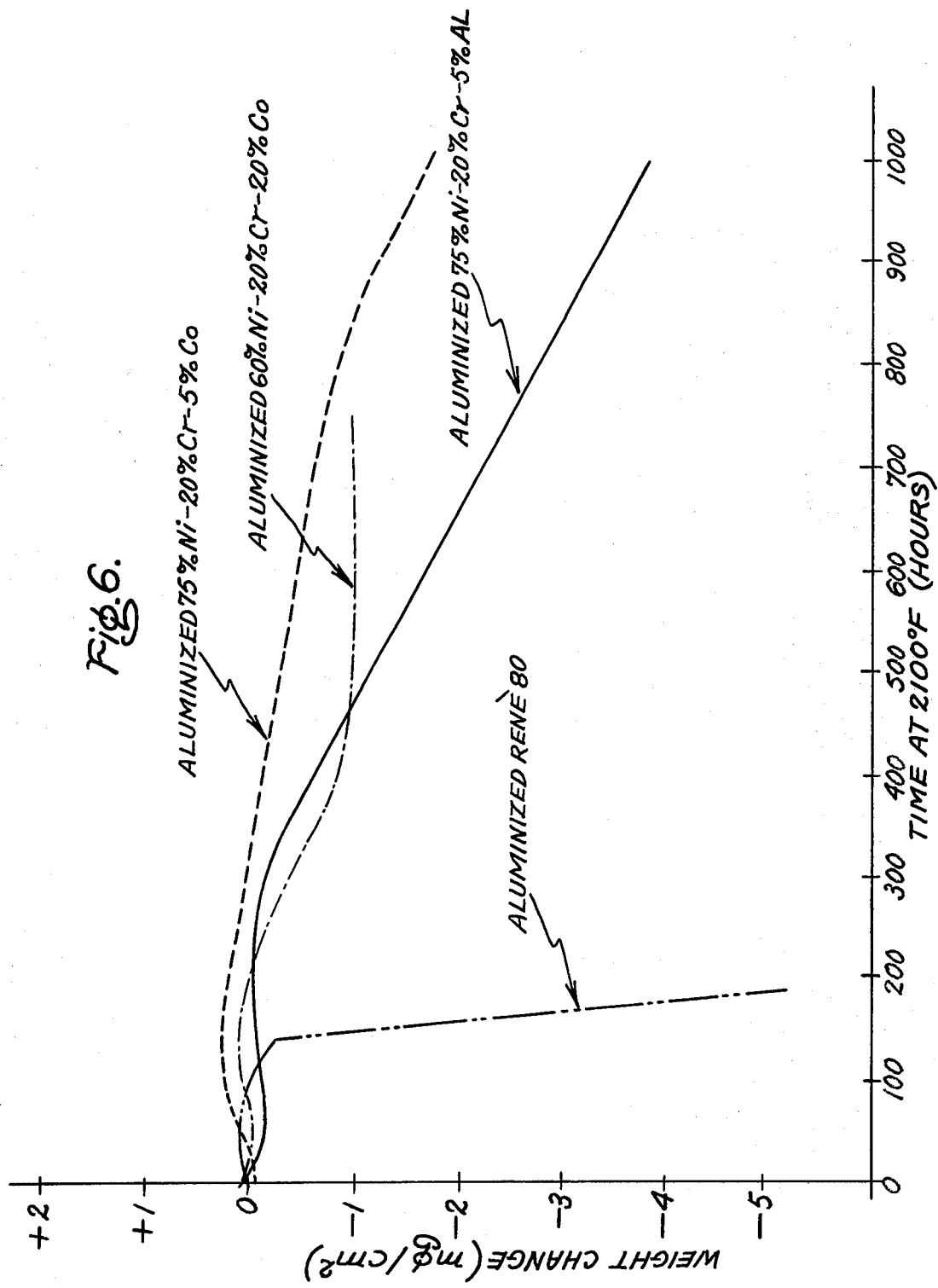
Figure 7:
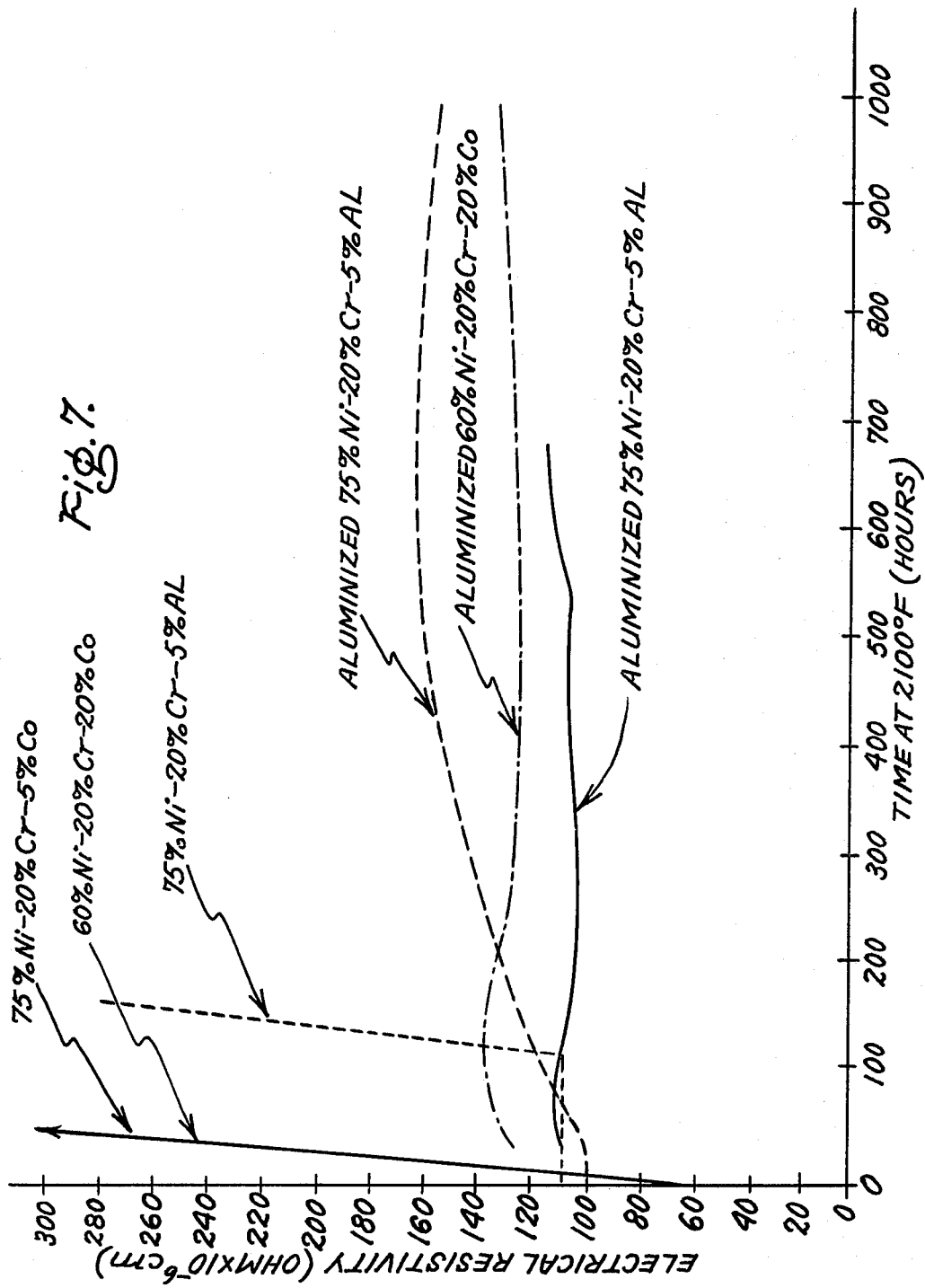

FIG. 6 is a graph of the weight change with time of aluminized nickel-chromium non-super alloy wires of the compositions: 75% Ni — 20% Cr — 5% Co; 60% Ni — 20% Cr — 20% Co; 75% Ni — 20% Cr — 5% Al and an aluminized Rene 80 nickel-base superalloy rod of the composition of FIG. 5. Each aluminized wire specimen was aluminized 3 hours by pack cementation employing a pack containing 5.8% Al — 0.2% NH$_4$F — 94% Al$_2$O$_3$ at a temperature of 1,060° C. in an inert argon atmosphere. The weight change of the test specimen wires (4 long × 0.07 inches wide × 0.01 inches thick) was measured at room temperature 3 times per week following removal from a 2,100° F. oxidation furnace during test time periods of up to 1,000 hours; and FIG. 7 is a graph of the resistivity measured in micro-ohm-cm of the unaluminized and aluminized alloy wires of the compositions of FIG. 6 (except for Rene 80) after removal from the 2,100° F. oxidation furnace during the same time test intervals described in FIG. 6.

Figure 1:
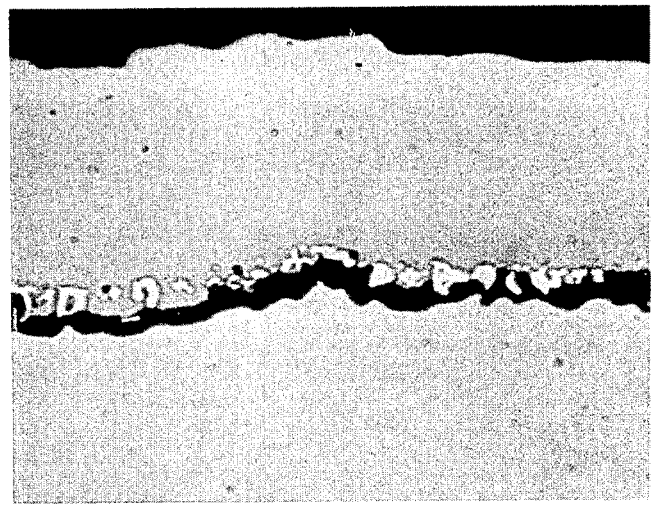
FIG. 1 is a photomicrograph (750×) of an aluminized 80% Ni — 20% Cr non-super-strength alloy which is not of the invention showing a continuous brittle α-chrome layer substrate boundary, i.e. a nonadhering coating.

As illustrated by FIG. 1, in the absence of substantial amounts of cobalt alloyed with nickel and chromium, aluminized nickel-chromium alloys form a continuous brittle α-chrome layer at the alloy coating and substrate interface whereby the mechanical integrity of the oxidation resistance aluminide coating is destroyed thereby rendering the alloy compositions deficient in oxidation and corrosion resistance.

Figure 2:
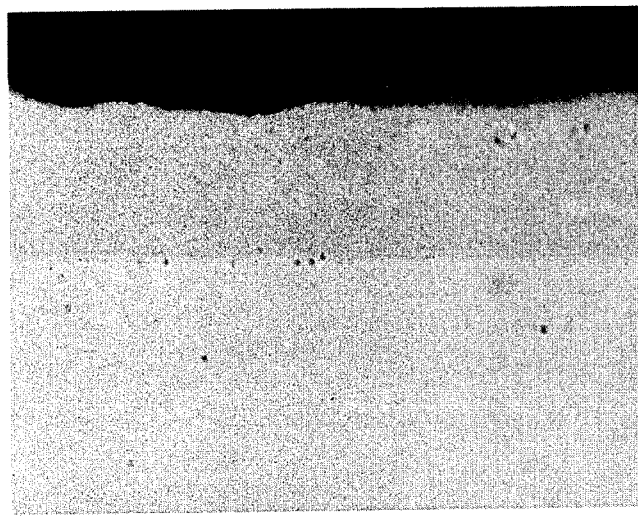
FIG. 2 is a photomicrograph (750×) of an aluminized 75% Ni — 20% Cr — 5% Co non-super-strength alloy of the invention.
Figure 3:
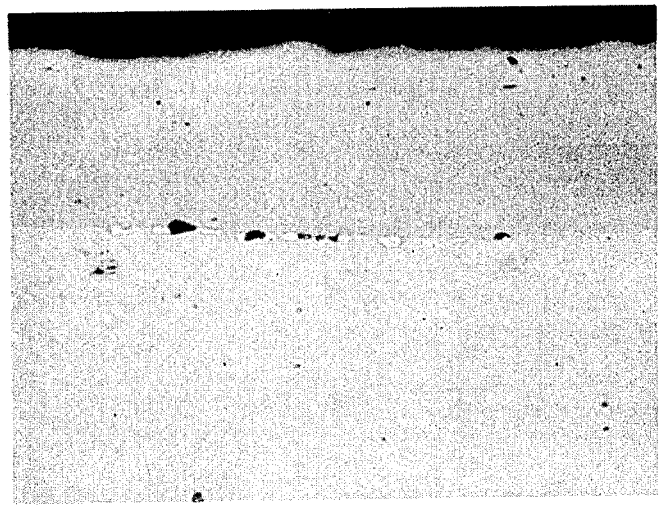
FIG. 3 is a photomicrograph (750×) of an aluminized 78% Ni — 20% Cr — 2% Co non-super-strength alloy of the invention.
Figure 4:
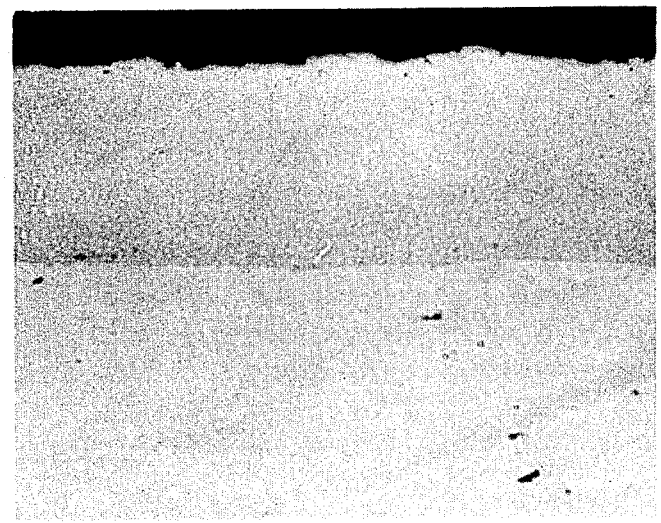
FIG. 4 is a photomicrograph (750×) of an aluminized 70% Ni — 20% Cr — 10% Co non-super-strength alloy of the invention.

As illustrated by FIGS. 2, 3 and 4, the addition of cobalt to a nickel-chromium non-superalloy provides an alloy which when aluminized does not not have a continuous brittle α-chrome layer substrate boundary.

FIG. 5 illustrates that the morphology of an aluminized nickel base superalloy, e.g. Rene 80, is not analogous to the morphology of the aluminized non-superalloy nickel chromium alloys which are employed in the practice of my invention.

FIG. 6 illustrates the nominal variation in the rate of weight change per unit of area of the aluminized non-superalloy nickel-chromium alloys prepared by the method of my invention when contrasted with the substantial rate of weight change per unit of area of other aluminized alloys, such as 75% Ni — 20% Cr — 5% Al or Rene 80 during exposure to the deleterious effects of oxidizing atmospheres at high temperatures.

FIG. 7 illustrates the improved electrical resistivity of aluminized nickel-chromium-cobalt alloy wire obtained by the practice of my invention by direct comparison with the electrical resistivity of nonaluminized nickel-chromium-cobalt alloy wire.

My invention is furter illustrated by the following examples:

EXAMPLES I-V

Various compositions as shown in Table 1 below were induction melted in an argon atmosphere and cast into ingots 1½ in. diameter and 5 in. long.

Table 1

| Sample | Ni | Cr | Co |
|---|---|---|---|
| Ex. I | 80% | 20% | 0% |
| " II | 78 | 20 | 2 |
| " III | 75 | 20 | 5 |
| " IV | 70 | 20 | 10 |
| " V | 60 | 20 | 20 |

Test specimens were cut from each of the samples and placed in an Inconel 600 retort containing an aluminizing powder pack consisting of 5.8% Al, 96% Al$_2$O$_3$ and 0.2% NH$_4$F. The aluminizing process used was 3 hours at 1160° C. in a slowly flowing pure argon atmosphere.

The test specimens were weighed before and after aluminization to determine the amount of aluminum deposited. The results were as follows:

Table 2

| Sample | Wt. Gain/Unit Area |
|---|---|
| Ex. I | 5.8 mg/cm$^2$ |
| " II | 5.9 |
| " III | 5.8 |
| " IV | 5.7 |
| " V | 6.3 |

It was determined that a thickness equivalent to about 1 mil aluminum is equal to a weight gain of 6.85 mg/cm$^2$. The results indicate that the presence of cobalt in the alloy composition has no adverse effect upon the subsequent aluminizing procedure.

After processing, the samples were cooled in an argon atmosphere and then cross-sectioned for metallographic examination. The problem associated with aluminizing nickel-chromium alloys is illustrated by FIG. 1 which shows a sample of aluminized 80% Ni — 20% Cr. It can be seen that the coating has completely separated from the substrate. Note the regions of "light phase" in the coating at or near the line of separation.

FIG. 2 shows a comparable cross-section of aluminized 75% Ni — 20% Cr — 5% Co. It can be seen that a dense, adherent aluminized coating is formed on this alloy.

FIGS. 1 and 2 can be compared with the cross-section of aluminized 78% Ni — 20% Cr — 2% Co as shown in FIG. 3. This coating is relatively dense although there is a suggestion of a few pores developing. Of particular interest are the small regions of light phase that can be seen at the coating substrate interface. It appears that the development of this light phase coincides with the first evidence of porosity as the cobalt concentration is lowered in the NiCoCr alloy.

The light phase may act as a diffusion barrier to the inwardly diffusing Al atoms, but may also act as a diffusion medium for the outwardly diffusing Ni atoms. This condition could lead to the formation of Kirkendall voids in the substrate.

It is concluded from these examples that a cobalt addition of at least 2% Co to NiCr-type alloys will permit the formaton of a dense, adherent aluminized layer on the alloys.

It will be appreciated that the invention is not limited to the specific details shown in the example and illustrations and that various modifications may be made within the ordinary skill in the art without departing from the spirit and scope of the invention.

I claim:

1. A method of improving the high temperature oxidation resistance of a non-super-strength alloy body comprising forming an alloy consisting essentially of, on a weight basis, 10–30% chromium, 2–20% cobalt said amount of cobalt being sufficient to prevent the formation of a continuous brittle α-chrome phase, 0–2.5% manganese, 0–1.5% silicon, 0–1.0% iron, 0–0.25% carbon, 0–0.1% sulfur, and the balance being nickel, and subjecting said body to a diffusion coating consisting essentially of aluminum whereby an inherently bonded, substantially pore-free aluminum coating results.

2. The claim 1 method wherein said aluminum coating is deposited by pack cementation.

3. The claim 2 method wherein said aluminum coating is deposited to a thickness of 1-3 mils.

4. The claim 3 method wherein said alloy contains 19–21% chromium and 4–6% cobalt.

5. The claim 3 method wherein said coating is deposited by chemical vapor deposition.

6. The claim 5 method wherein said chemical vapor deposition is carried out at a temperature of about 1,160° C. for about 3 hours.

7. The claim 3 method wherein said coating is deposited by pack cementation.

8. The claim 1 method wherein the coating substrate interface is substantially free of a continuous brittle alpha-chrome phase.

9. The claim 1 method, wherein said aluminum coating is deposited by slurry and diffusion.

10. The claim 1 method, wherein said aluminum coating is deposited by electrophoresis and diffusion.

11. The claim 1 method, wherein said aluminum coating is deposited by hot dipping.

12. The claim 1 method, wherein said aluminum coating is deposited by chemical vapor deposition.

13. The claim 1 method, wherein said aluminum coating is deposited by fused salt metalliding.

14. The claim 1 method, wherein said aluminum coating is deposited by physical vapor deposition.

* * * * *